(12) United States Patent
Salzman et al.

(10) Patent No.: US 9,006,864 B2
(45) Date of Patent: Apr. 14, 2015

(54) RADIATION INDUCED DIODE STRUCTURE

(71) Applicant: Texas Instruments Incorporated, Dallas, TX (US)

(72) Inventors: James Fred Salzman, Anna, TX (US); Richard Guerra Roybal, Denton, TX (US); Randolph William Kahn, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 14/073,777

(22) Filed: Nov. 6, 2013

(65) Prior Publication Data

US 2014/0124895 A1   May 8, 2014

Related U.S. Application Data

(60) Provisional application No. 61/723,025, filed on Nov. 6, 2012.

(51) Int. Cl.

| | |
|---|---|
| H01L 29/73 | (2006.01) |
| H01L 21/265 | (2006.01) |
| H01L 29/66 | (2006.01) |
| H01L 29/732 | (2006.01) |
| H01L 29/06 | (2006.01) |

(52) U.S. Cl.
CPC ....... H01L 29/66272 (2013.01); *H01L 21/2652* (2013.01); H01L 29/7322 (2013.01); H01L 29/0692 (2013.01)

(58) Field of Classification Search
CPC ... H01L 21/265; H01L 21/266; H01L 21/268; H01L 29/73; H01L 29/66
USPC .......................................... 257/592; 438/350
See application file for complete search history.

(56) References Cited

U.S. PATENT DOCUMENTS

| | | | | |
|---|---|---|---|---|
| 4,619,036 A | * | 10/1986 | Havemann et al. | 438/334 |
| 4,674,173 A | * | 6/1987 | Hahn et al. | 438/348 |
| 4,706,378 A | * | 11/1987 | Havemann | 438/363 |
| 4,752,817 A | * | 6/1988 | Lechaton et al. | 257/517 |
| 4,835,580 A | * | 5/1989 | Havemann et al. | 257/478 |
| 5,013,671 A | * | 5/1991 | Havemann | 438/374 |
| 5,124,271 A | * | 6/1992 | Havemann | 438/703 |
| 5,171,702 A | * | 12/1992 | Prengle et al. | 438/207 |
| 5,374,845 A | * | 12/1994 | Havemann | 257/592 |
| 5,910,676 A | * | 6/1999 | Prengle et al. | 257/378 |
| 6,191,457 B1 | * | 2/2001 | Prengle et al. | 257/370 |
| 2007/0273007 A1 | * | 11/2007 | Grutzediek et al. | 257/592 |
| 2009/0179228 A1 | * | 7/2009 | Joseph et al. | 257/197 |

* cited by examiner

*Primary Examiner* — Nikolay Yushin
(74) *Attorney, Agent, or Firm* — Jacqueline J. Garner; Frank Cimino

(57) ABSTRACT

A semiconductor device containing an NPN bipolar junction transistor may be formed by forming a p-type radiation induced diode structure (RIDS) region in an intrinsic p-type base region of the NPN bipolar junction transistor at a boundary of the intrinsic p-type base region with a dielectric layer over a substrate of the semiconductor device, between an emitter of the NPN bipolar junction transistor and an extrinsic p-type base region of the NPN bipolar junction transistor. The p-type RIDS region has a doping density high enough to prevent inversion of a surface of the p-type RIDS region adjacent to the dielectric layer when trapped charge is accumulated in the dielectric layer, while the intrinsic p-type base region may invert from the trapped charge forming the radiation induced diode structure. The p-type RIDS region is separated from the emitter and from the extrinsic base region by portions of the intrinsic base region.

20 Claims, 10 Drawing Sheets

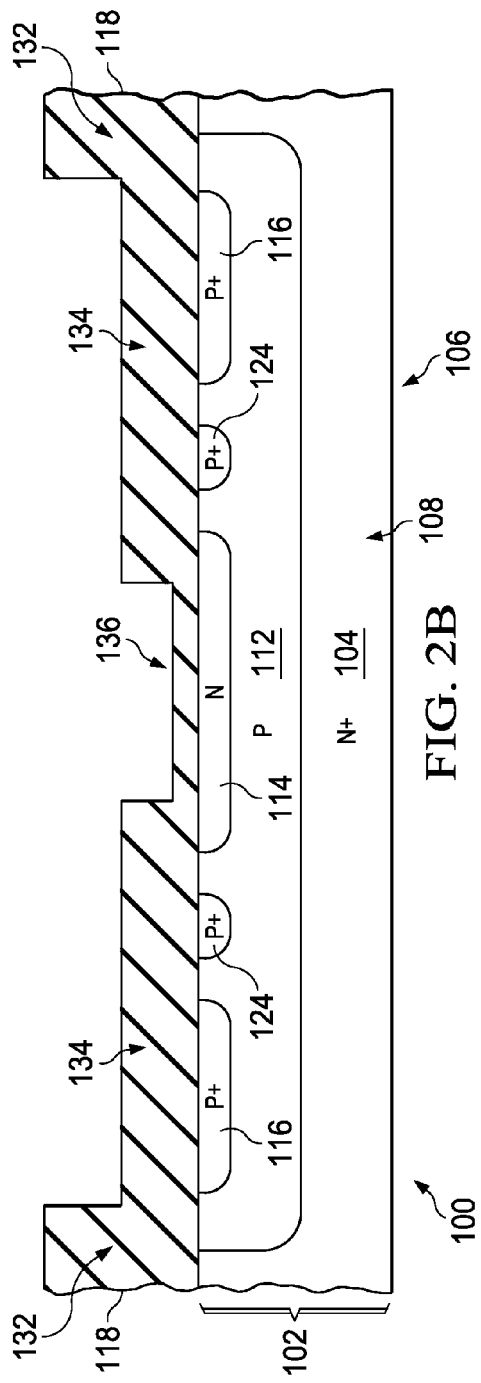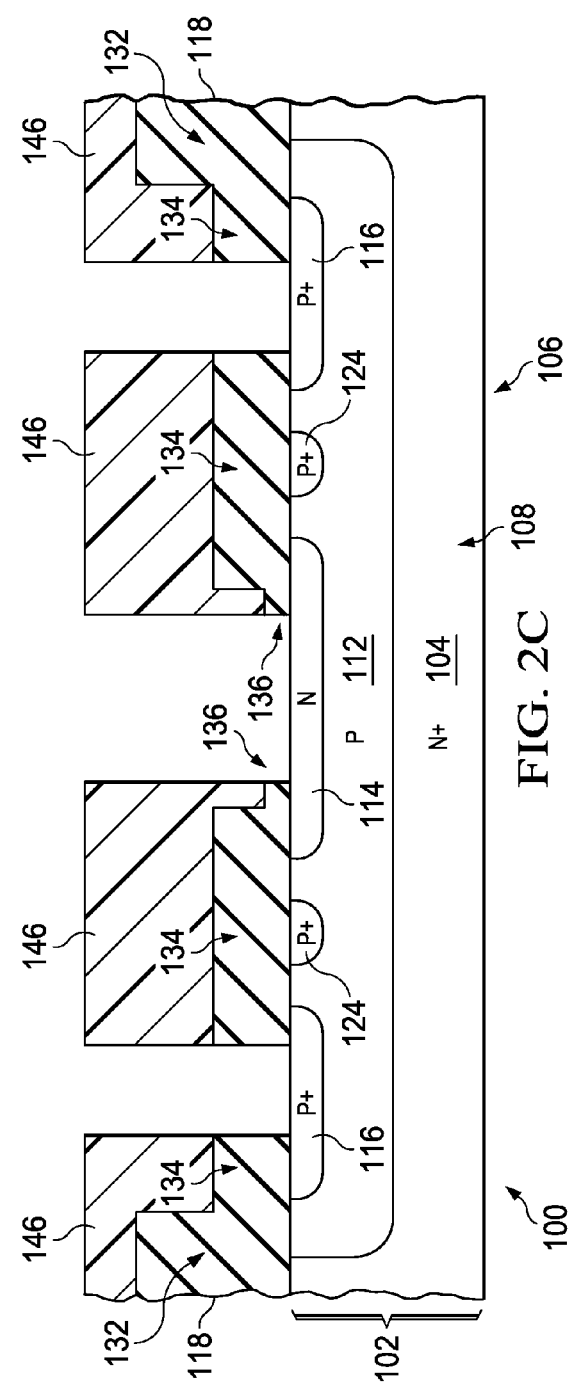

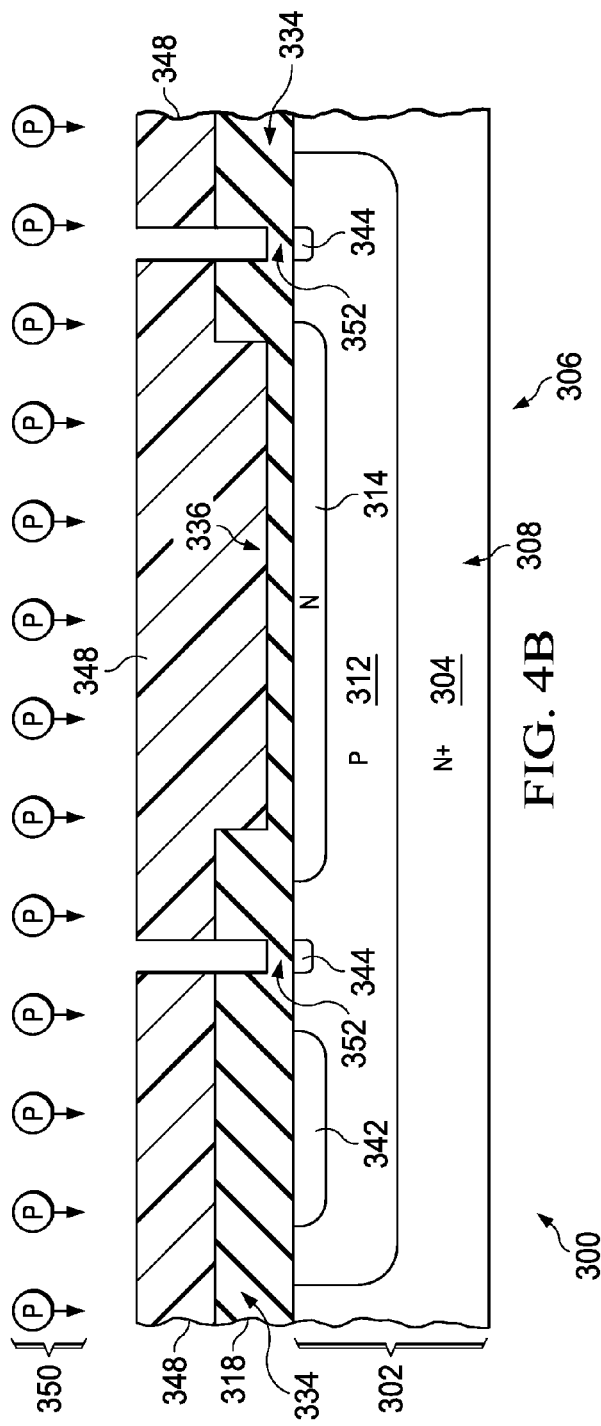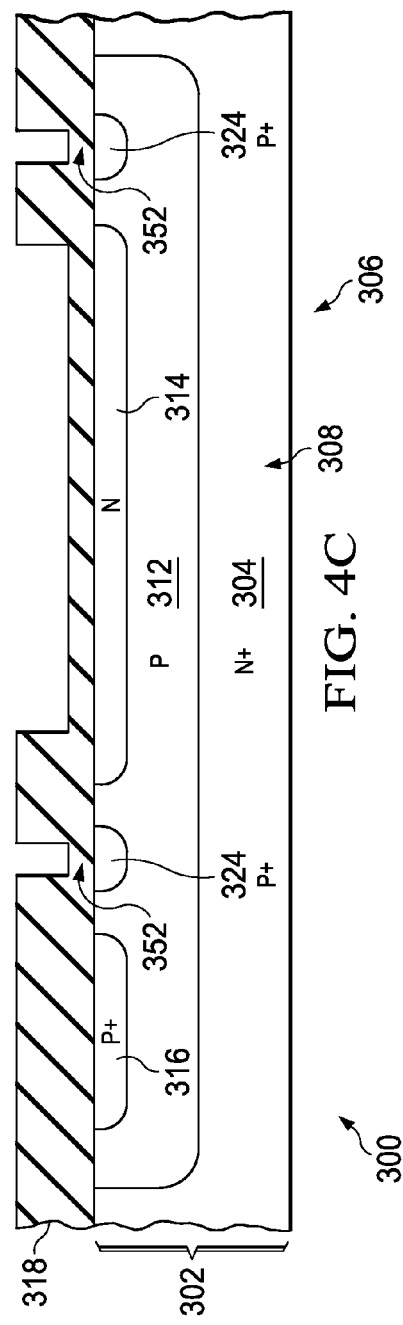
FIG. 4B
FIG. 4C

RADIATION INDUCED DIODE STRUCTURE

CROSS-REFERENCE TO RELATED APPLICATIONS

This application claims the benefit of priority under U.S.C. §119(e) of U.S. Provisional Application 61/723,025 filed Nov. 6, 2012.

FIELD OF THE INVENTION

This invention relates to the field of semiconductor devices. More particularly, this invention relates to bipolar junction transistors in semiconductor devices.

BACKGROUND OF THE INVENTION

Semiconductor devices containing bipolar junction transistors which are exposed to radiation may accumulate trapped charge in dielectric layers. Trapped positive charge in a dielectric layer on a p-type semiconductor region may invert a surface of the p-type region adjacent to the trapped charge, forming a layer of electrons which may degrade performance of the bipolar junction transistor. Obtaining long-term reliable operation of bipolar junction transistors exposed to radiation has been problematic.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A semiconductor device containing an NPN bipolar junction transistor may be formed by forming a p-type radiation induced diode structure (RIDS) region in an intrinsic p-type base region of the NPN bipolar junction transistor at a boundary of the intrinsic p-type base region with a dielectric layer over a substrate of the semiconductor device, between an emitter of the NPN bipolar junction transistor and an extrinsic p-type base region of the NPN bipolar junction transistor. The p-type RIDS region is separated from the emitter and from the extrinsic base region by portions of the intrinsic base region.

DESCRIPTION OF THE VIEWS OF THE DRAWING

FIG. 2A through FIG. 2C are cross sections of the semiconductor device of FIG. 1A and FIG. 1B, depicted in stages of fabrication.

FIG. 4A through FIG. 4D are cross sections of the semiconductor device of FIG. 3A and FIG. 3B, depicted in stages of fabrication.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

A semiconductor device containing an NPN bipolar junction transistor may be formed by forming a p-type radiation induced diode structure (RIDS) region in an intrinsic p-type base region of the NPN bipolar junction transistor at a boundary of the intrinsic p-type base region with a dielectric layer, between an emitter of the NPN bipolar junction transistor and an extrinsic p-type base region of the NPN bipolar junction transistor. The p-type RIDS region has a doping density high enough to prevent inversion of a surface of the p-type RIDS region adjacent to the dielectric layer when trapped charge is accumulated in the dielectric layer. The p-type RIDS region is separated from the emitter and from the extrinsic base region by portions of the intrinsic base region.

Figure 1A:
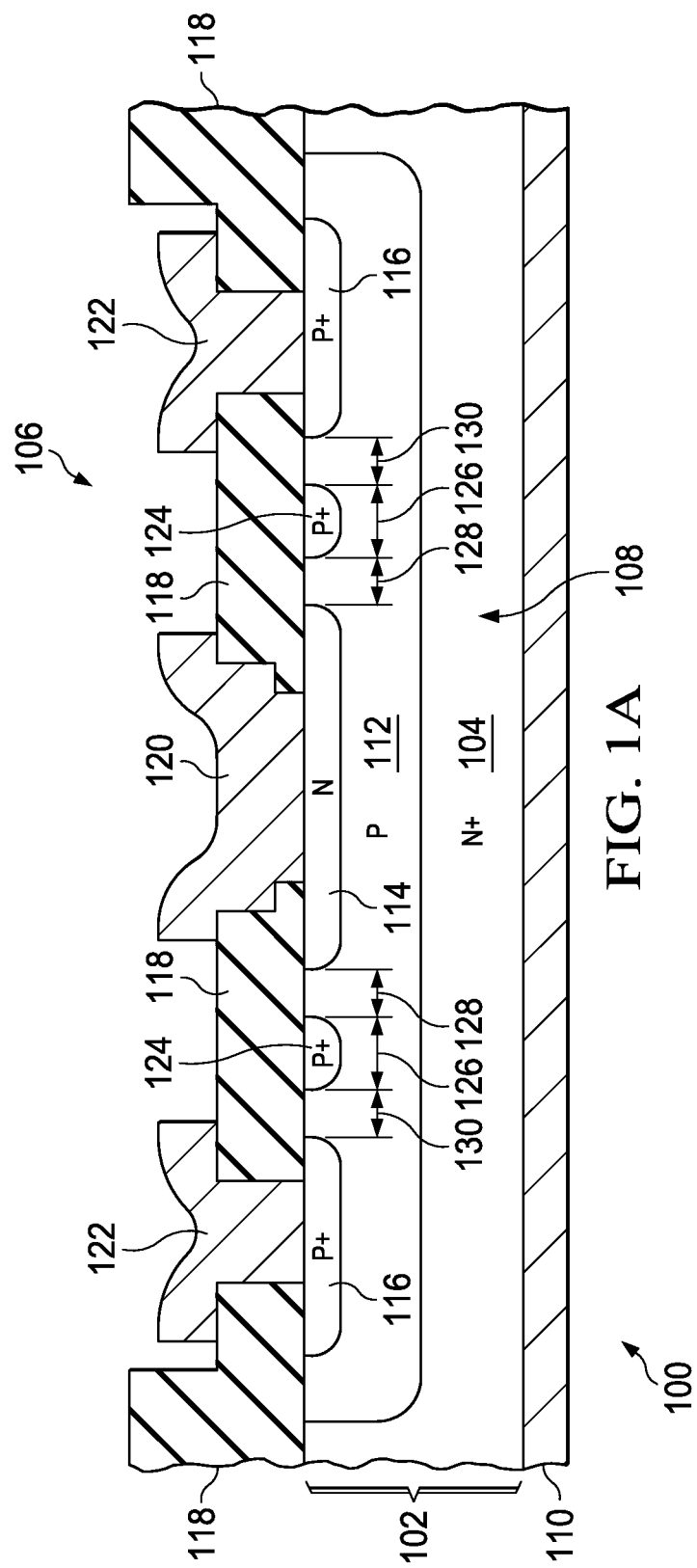
FIG. 1A is a cross section and FIG. 1B is a top view of an exemplary semiconductor device containing an NPN bipolar junction transistor with a p-type RIDS region.
Figure 1B:
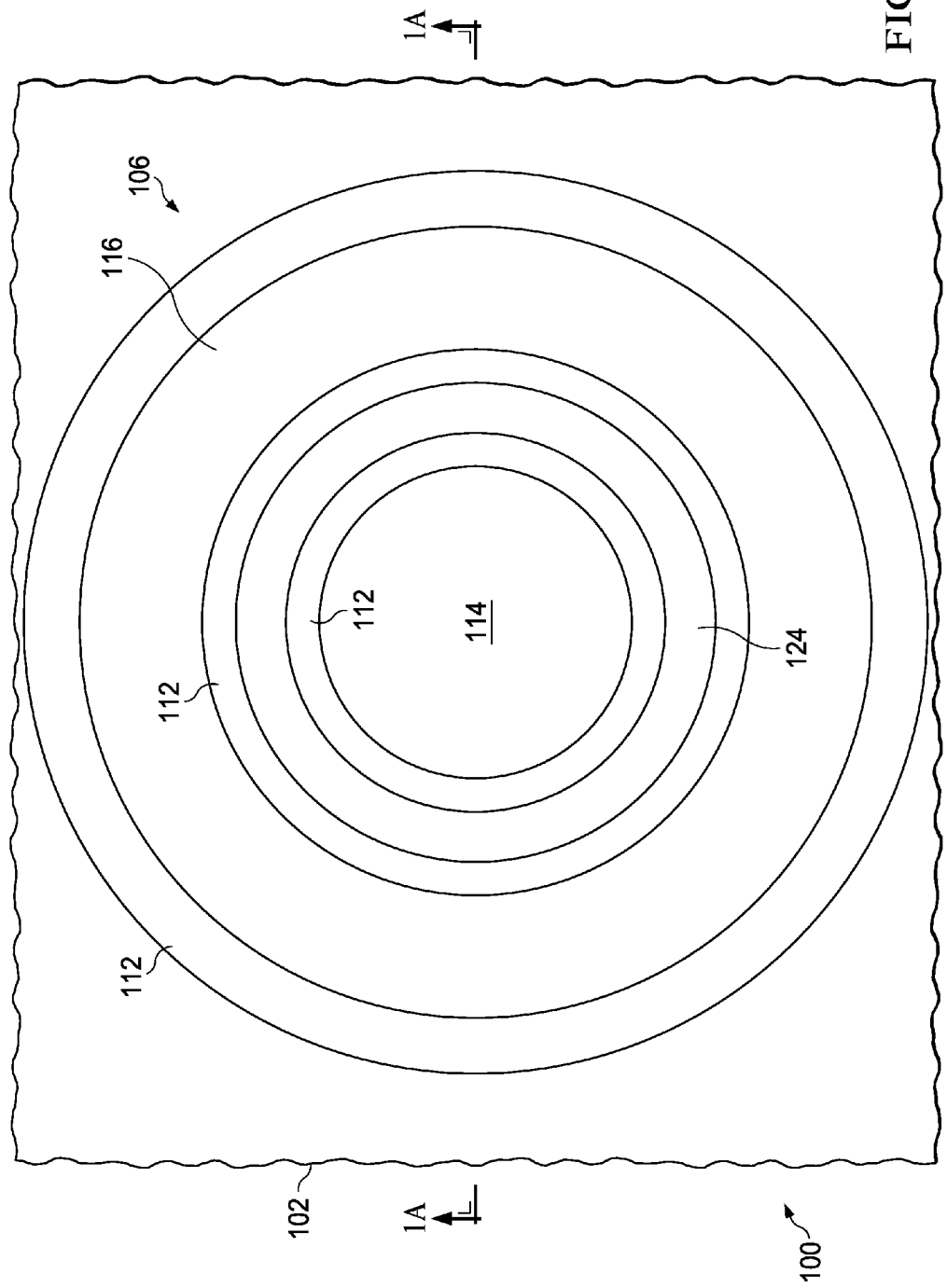

FIG. 1A is a cross section and FIG. 1B is a top view of an exemplary semiconductor device containing an NPN bipolar junction transistor with a p-type RIDS region. Referring to FIG. 1A, the semiconductor device 100 is formed on a substrate 102 which includes n-type semiconductor material 104. The substrate 102 may be, for example, a single crystal bulk silicon wafer having a substantially uniform doping density throughout the wafer, a heavily doped silicon wafer with an epitaxial layer, or other substrate suitable for forming the semiconductor device 100. The NPN bipolar junction transistor 106 includes an n-type collector region 108 in the n-type semiconductor material 104. A collector contact 110, depicted in FIG. 1A as a bottom contact layer, provides an electrical connection to the collector region 108. Other configurations for the collector contact 110 are within the scope of the instant example. The NPN bipolar junction transistor 106 includes a p-type intrinsic base region 112 formed in the substrate 102 above the collector region 108. The NPN bipolar junction transistor 106 further includes an n-type emitter 114 formed in the substrate 102 above the intrinsic base region 112. The emitter 114 extends to a top surface of the substrate 102. A p-type extrinsic base region 116 is formed in the intrinsic base region 112 extending to the top surface of the substrate 102 so as to provide a base contact region. In the instant example, the extrinsic base region 116 surrounds the emitter 114. The intrinsic base region 112 extends to the top surface of the substrate 102 between the emitter 114 and the extrinsic base region 116.

A dielectric layer 118 is formed on the substrate 102 over the intrinsic base region 112, the extrinsic base region 116 and the emitter 114. The dielectric layer 118 may include, for example, one or more layers of silicon dioxide and possibly silicon nitride or silicon oxynitride. Silicon dioxide in the dielectric layer 118 may be thermal oxide. The dielectric layer 118 extends on the top surface of the substrate 102 over the intrinsic base region 112 between the emitter 114 and the extrinsic base region 116. An emitter contact 120 is formed of metal on the emitter 114 through the dielectric layer 118 to provide an electrical connection to the emitter 114. A base contact 122 is formed of metal on the extrinsic base region 116 through the dielectric layer 118 to provide an electrical connection to the intrinsic base region 112.

A p-type RIDS region 124 is formed in the substrate 102 in the intrinsic base region 112 between the emitter 114 and the extrinsic base region 116, adjacent to the dielectric layer 118. An average doping density of the RIDS region 124 is at least 5 times an average doping density of the intrinsic base region 112. For example, the intrinsic base region 112 may have an average doping density of $2 \times 10^{18}$ cm$^{-3}$, and the RIDS region 124 may have an average doping density greater than $1 \times 10^{19}$ cm$^{-3}$. In the instant example, the average doping density of the RIDS region 124 and the extrinsic base region 116 are substantially equal. A width 126 of the RIDS region 124 is sufficient to maintain the top surface of the substrate p-type after accumulation of a prescribed density of trapped charge in the dielectric layer 118. The width 126 of the RIDS region 124 may be determined, for example, by a minimum resolution of a photolithographic process used to form an implant mask for the RIDS region 124. The width 126 of the RIDS region 124 may be, for example, at least 200 nanometers. The RIDS region 124 is separated from the emitter 114 by a space 128 sufficient to enable operation of the NPN bipolar junction transistor 106 with a desired current gain. The space 128 between the RIDS region 124 and the emitter 114 may depend on a desired emitter-base breakdown voltage of the NPN bipolar junction transistor 106. for example, a version of the NPN bipolar junction transistor 106 with a emitter-base breakdown voltage of 6 volts may have a space 128 between the RIDS region 124 and the emitter 114 of 1 micron to 2 microns. The RIDS region 124 is separated from the extrinsic base region 116 by a space 130 sufficient to avoid a significant increase in doping density in the intrinsic base region 112 between RIDS region 124 and the extrinsic base region 116 due to diffusion of p-type dopants from the RIDS region 124 and the extrinsic base region 116. The space 130 between the RIDS region 124 and the extrinsic base region 116 may be, for example 0.7 microns to 1.5 microns.

Referring to FIG. 1B, the dielectric layer 118, the emitter contact 120 and the base contact 122 of FIG. 1A have been omitted to more clearly show the spatial relationships among the intrinsic base region 112, the extrinsic base region 116, the emitter 114 and the RIDS region 124. In the instant example, the emitter 114 is centrally located in the intrinsic base region 112. The extrinsic base region 116 surrounds the emitter 114. The RIDS region 124 surrounds the emitter 114 in the intrinsic base region 112 between the emitter 114 and the extrinsic base region 116. Forming the RIDS region 124 surrounding the emitter 114 may advantageously provide reliable operation of the NPN bipolar junction transistor 106 at higher levels of accumulated trapped charge compared to other configurations of the RIDS region 124.

Figure 2A:
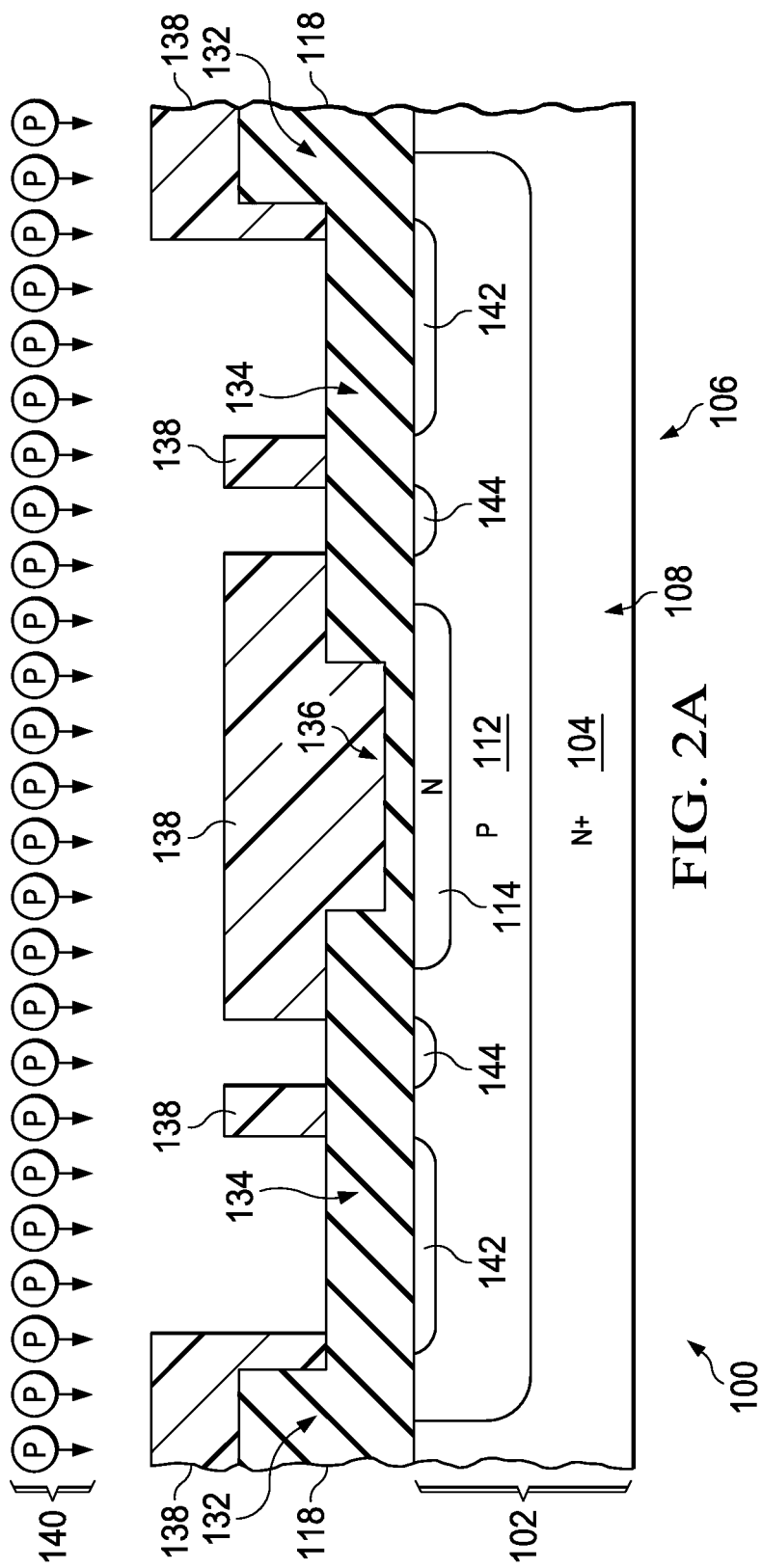

FIG. 2A through FIG. 2C are cross sections of the semiconductor device of FIG. 1A and FIG. 1B, depicted in stages of fabrication. Referring to FIG. 2A, a thick layer of silicon dioxide 132, for example 1 micron to 2 microns thick, is formed on the top surface of the substrate 102 as part of the dielectric layer 118. The thick layer of silicon dioxide 132 may be formed by thermal oxidation of silicon in the semiconductor material 104.

A photoresist mask which exposes an area for the intrinsic base region 112 is formed over the existing dielectric layer 118 by a photolithographic process, and the thick layer of silicon dioxide 132 is removed in the area exposed by the mask, for example by a wet etch process using a buffered solution of aqueous hydrofluoric acid. The mask is removed, for example by an oxygen plasma etch, or ash, process, an organic wet cleanup process using organic photoresist removers, and/or a wet etch process using an aqueous mixture of sulfuric acid and hydrogen peroxide. An intermediate layer of silicon dioxide 134, for example 300 nanometers to 600 nanometers thick, is formed in the area in which the thick layer of silicon dioxide 132 was removed, and becomes part of the dielectric layer 118. The intermediate layer of silicon dioxide 134 may also be formed by thermal oxidation of the silicon in the semiconductor material 104. P-type dopants such as boron are implanted through the intermediate layer of silicon dioxide 134 into the substrate 102 to provide doping for the intrinsic base region 112. The p-type dopants may be implanted at a dose of, for example, $1 \times 10^{14}$ cm$^{-2}$ to $5 \times 10^{14}$ cm$^{-2}$ and an energy between 100 keV and 300 keV, so that the p-type dopants outside the area for the intrinsic base region 112 are absorbed by the thick layer of silicon dioxide 132. The substrate 102 is subsequently annealed so as to diffuse and activate the implanted p-type dopants to form the intrinsic base region 112.

A photoresist mask which exposes an area for the emitter 114 is formed over the existing dielectric layer 118 by a photolithographic process, and the intermediate layer of silicon dioxide 134 is removed in the area exposed by the mask, for example by a wet etch process. N-type dopants such as phosphorus and/or arsenic are implanted into the substrate at a dose of $1 \times 10^{15}$ cm$^{-2}$ to $5 \times 10^{15}$ cm$^{-2}$ and an energy between 50 keV and 100 keV. The N-type dopants outside the area for the emitter 114 are absorbed by the mask and the existing dielectric layer 118. The mask is subsequently removed. A thermal process which diffuses and activates the implanted n-type dopants and concurrently grows a thin layer of silicon dioxide 136 is performed; the activated n-type dopants form the emitter 114. The thin layer of silicon dioxide 136 may be, for example, 75 nanometers to 150 nanometers thick, and becomes part of the dielectric layer 118.

A photoresist mask 138 is formed over the existing dielectric layer 118 so as to expose an area for the extrinsic base region 116 and an area for the RIDS region 124 of FIG. 1A and FIG. 1B. P-type dopants 140 such as boron are implanted through the intermediate layer of silicon dioxide 134 into the substrate 102 to form an extrinsic base implanted region 142 and a RIDS implanted region 144. The p-type dopants 140 may be implanted at a dose of, for example, $3 \times 10^{15}$ cm$^{-2}$ to $1 \times 10^{16}$ cm$^{-2}$ and an energy sufficient to place a peak of a distribution of the implanted p-type dopants 140 close to the top surface of the substrate 102. The p-type dopants 140 outside the areas exposed by the photoresist mask 138 are absorbed by the photoresist mask 138 and the dielectric layer 118. The photoresist mask 138 is subsequently removed, for example by an ash process, an organic wet cleanup process or a wet etch process.

Referring to FIG. 2B, the substrate 102 is annealed, for example at 850° C. for 60 minutes or equivalent anneal conditions such as 900° C. for 15 minutes, or 800° C. for 300 minutes. The implanted p-type dopants in the extrinsic base implanted region 142 and the RIDS implanted region 144 of FIG. 2A diffuse and become activated to form the extrinsic base region 116 and the RIDS region 124, respectively. Forming the RIDS region 124 concurrently with the extrinsic base region 116 may advantageously reduce fabrication cost and complexity of the semiconductor device 100.

Referring to FIG. 2C, a contact mask 146 is formed by a photolithographic process over the existing dielectric layer 118 so as to expose areas for the emitter contact 120 and the base contact 122 of FIG. 1A. The dielectric layer 118 is removed from the areas exposed by the contact mask 146, for example by a wet etch process. The contact mask 146 is subsequently removed, for example by an ash process or an organic wet cleanup process. The fabrication process is continued to form the semiconductor device 100 of FIG. 1A and FIG. 1B.

Figure 3A:
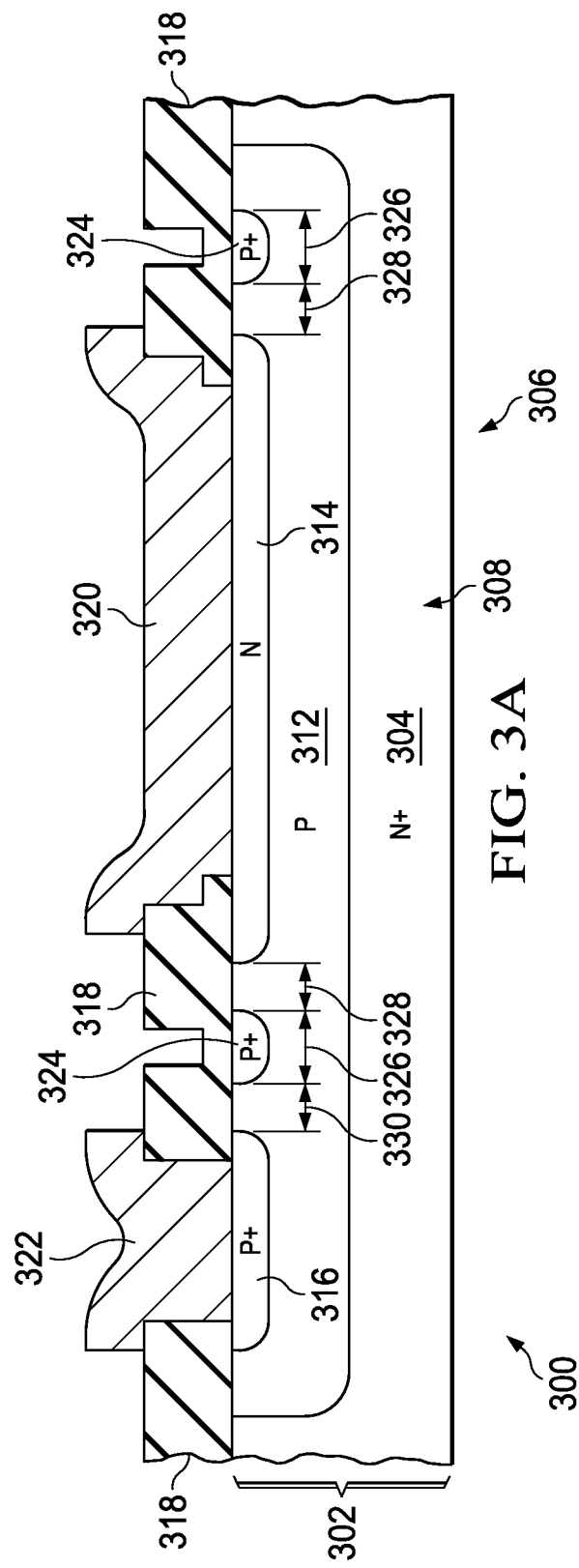
FIG. 3A is a cross section and FIG. 3B is a top view of another exemplary semiconductor device containing an NPN bipolar junction transistor with a p-type RIDS region.
Figure 3B:
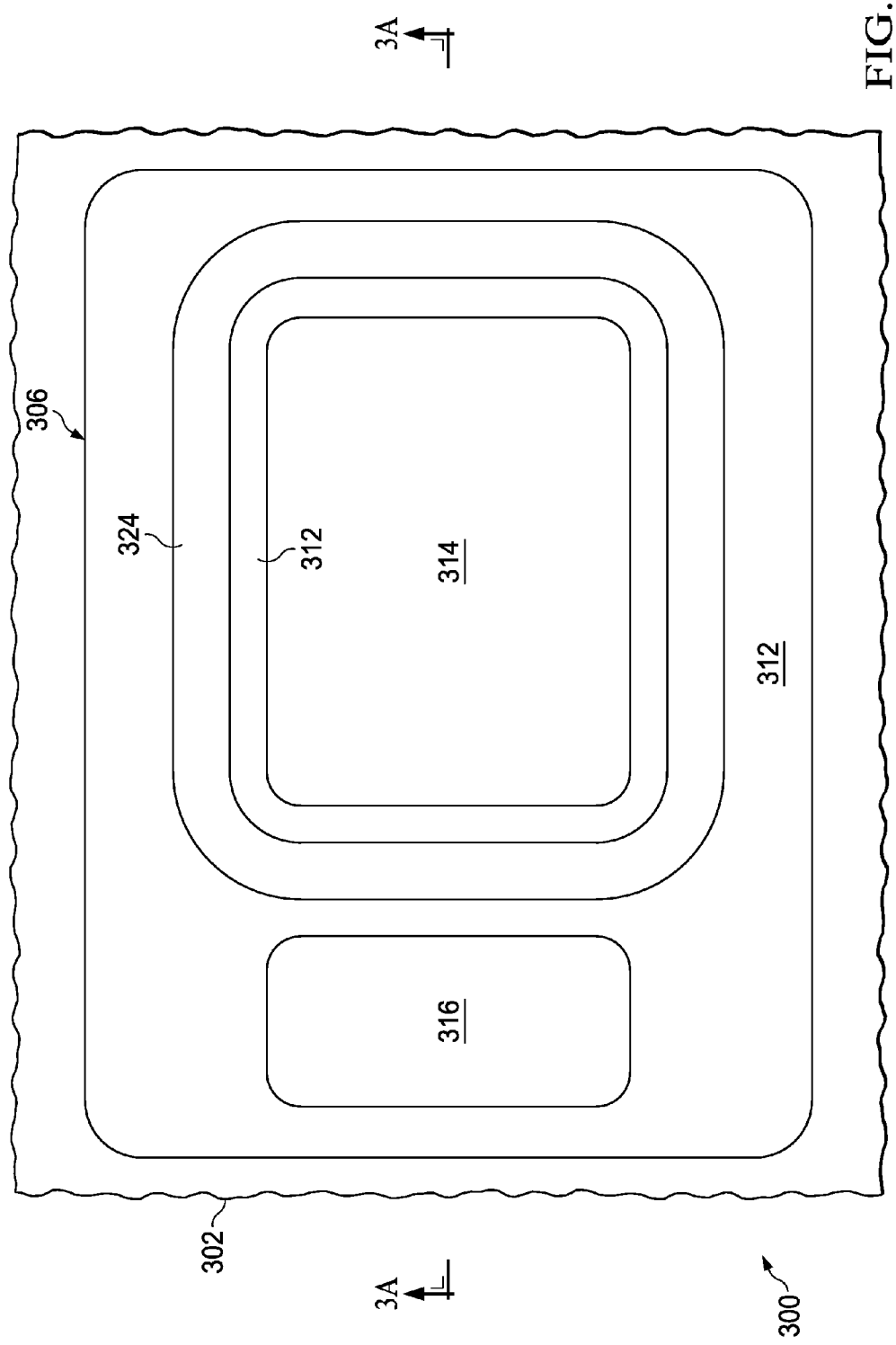

FIG. 3A is a cross section and FIG. 3B is a top view of another exemplary semiconductor device containing an NPN bipolar junction transistor with a p-type RIDS region. Referring to FIG. 3A, the semiconductor device 300 is formed on a substrate 302 which includes n-type semiconductor material 304, for example as described in reference to FIG. 1A. The NPN bipolar junction transistor 306 includes an n-type collector region 308 in the n-type semiconductor material 304. A collector contact which provides an electrical connection to the collector region 308 may be located below the collector region 308 as described in reference to FIG. 1A, or may be located laterally proximate to the collector region 308 at a top surface of the substrate 302. The NPN bipolar junction transistor 306 includes a p-type intrinsic base region 312 formed in the substrate 302 above the collector region 308. The NPN bipolar junction transistor 306 further includes an n-type emitter 314 formed in the substrate 302 above the intrinsic base region 312. The emitter 314 extends to a top surface of the substrate 302. A p-type extrinsic base region 316 is formed in the intrinsic base region 312 extending to the top surface of the substrate 302 so as to provide a base contact region. In the instant example, the extrinsic base region 316 is located laterally adjacent to the emitter 314. The intrinsic base region 312 extends to the top surface of the substrate 302 between the emitter 314 and the extrinsic base region 316.

A dielectric layer 318 is formed on the substrate 302 over the intrinsic base region 312, the extrinsic base region 316 and the emitter 314, for example as described in reference to FIG. 1A. An emitter contact 320 is formed of metal on the emitter 314 through the dielectric layer 318 to provide an electrical connection to the emitter 314. A base contact 322 is formed of metal on the extrinsic base region 316 through the dielectric layer 318 to provide an electrical connection to the intrinsic base region 312.

A p-type RIDS region 324 is formed in the substrate 302 in the intrinsic base region 312 between the emitter 314 and the extrinsic base region 316, adjacent to the dielectric layer 318. An average doping density of the RIDS region 324 is at least 5 times an average doping density of the intrinsic base region 312. In the instant example, the average doping density of the RIDS region 324 is substantially different from of an average doping density of the extrinsic base region 316, for example, less than half of the average doping density of the extrinsic base region 316. Alternatively, the average doping density of the RIDS region 324 may be more than the average doping density of the extrinsic base region 316. A portion, or possibly all, of the dielectric layer 318 may be removed over the RIDS region 324, as shown in FIG. 3A, which may advantageously limit an amount of trapped charge which accumulates in the dielectric layer 318 over the RIDS region 324. A width 326 of the RIDS region 324 is sufficient to maintain the top surface of the substrate p-type after accumulation of a prescribed density of trapped charge in the dielectric layer 318. The width 326 of the RIDS region 324 may be, for example, at least 200 nanometers. The RIDS region 324 is separated from the emitter 314 by a space 328 sufficient to enable operation of the NPN bipolar junction transistor 306 with a desired current gain. The space 328 between the RIDS region 324 and the emitter 314 may be, for example 1 microns to 2 microns, for a 6 volt emitter-base breakdown voltage of the NPN bipolar junction transistor 306. The RIDS region 324 is separated from the extrinsic base region 316 by a space 330 sufficient to avoid a significant increase in doping density in the intrinsic base region 312 between RIDS region 324 and the extrinsic base region 316 due to diffusion of p-type dopants from the RIDS region 324 and the extrinsic base region 316. The space 328 between the RIDS region 324 and the extrinsic base region 316 may be, for example 0.5 microns to 1 micron. Forming the RIDS region 324 with a lower average doping density than the extrinsic base region 316 may enable a narrower space 328 between the RIDS region 324 and the extrinsic base region 316, advantageously enabling a smaller size for the semiconductor device 300.

Referring to FIG. 3B, the dielectric layer 318, the emitter contact 320 and the base contact 322 of FIG. 3A have been omitted to more clearly show the spatial relationships among the intrinsic base region 312, the extrinsic base region 316, the emitter 314 and the RIDS region 324. In the instant example, the extrinsic base region 316 is located on one side of the emitter 314. The RIDS region 324 surrounds the emitter 314 in the intrinsic base region 312. Forming the RIDS region 324 surrounding the emitter 314 may accrue the same advantages described in reference to FIG. 1B.

Figure 4A:
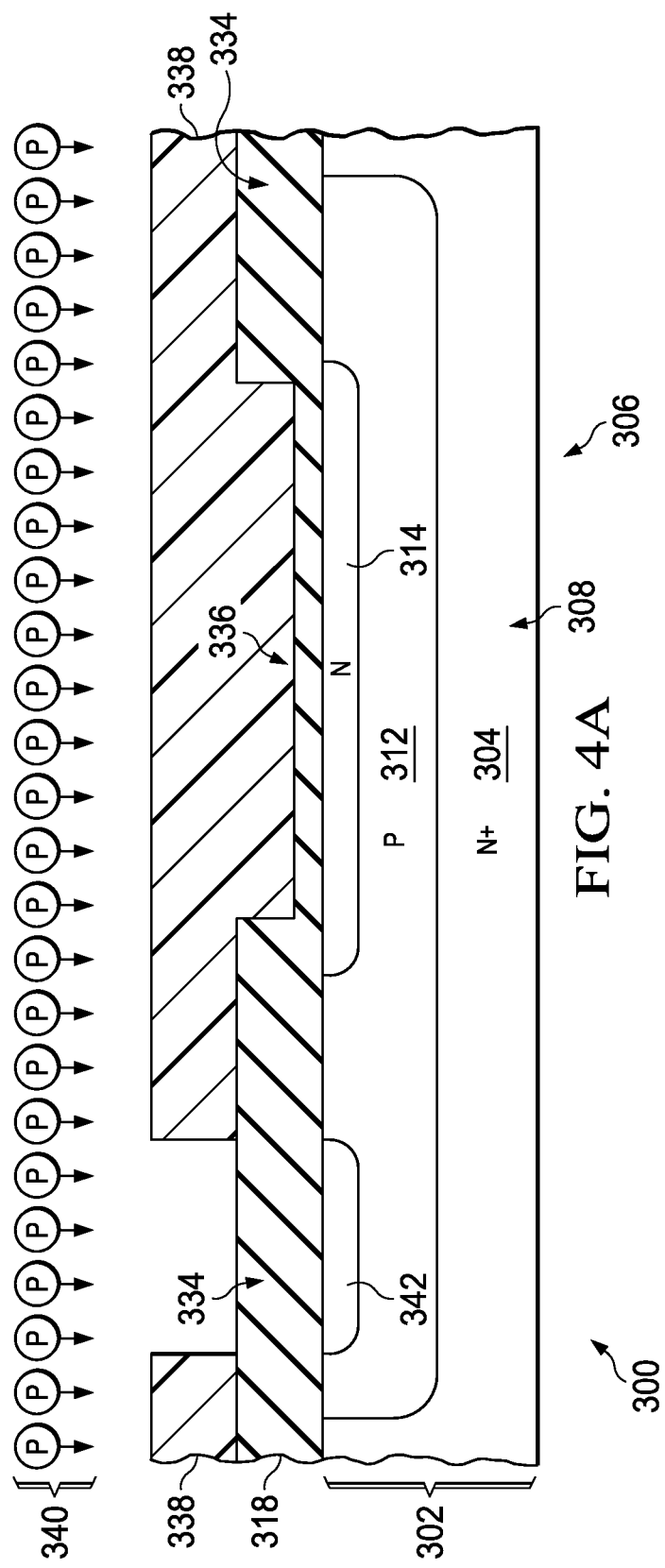

FIG. 4A through FIG. 4D are cross sections of the semiconductor device of FIG. 3A and FIG. 3B, depicted in stages of fabrication. Referring to FIG. 4A, an intermediate layer of silicon dioxide 334, for example 300 nanometers to 600 nanometers thick, is formed on the top surface of the substrate 302 as part of the dielectric layer 318. The intermediate layer of silicon dioxide 334 may be formed by thermal oxidation of silicon in the semiconductor material 304. The intrinsic base region 312 may be formed by forming a photoresist mask over the intermediate layer of silicon dioxide 334 to expose an area for the intrinsic base region 312; the photoresist mask being thick enough to absorb implanted p-type dopants outside the area for the intrinsic base region 312, for example 1.5 microns to 2 microns thick. The p-type dopants such as boron are implanted through the intermediate layer of silicon dioxide 334, the photoresist mask is removed and the substrate 302 is subsequently annealed to form the intrinsic base region 312 as described in reference to FIG. 2A. The emitter 314 may also be formed as described in reference to FIG. 2A.

A first photoresist mask 338 is formed over the existing dielectric layer 318 so as to expose an area for the extrinsic base region 316 while covering an area for the RIDS region 324 of FIG. 3A and FIG. 3B. A first set of p-type dopants 340 such as boron are implanted through the intermediate layer of silicon dioxide 334 into the substrate 302 to form an extrinsic base implanted region 342. The first set of p-type dopants 340 may be implanted at a dose of, for example, $3 \times 10^{15}$ cm$^{-2}$ to $1 \times 10^{16}$ cm$^{-2}$ and an energy sufficient to place a majority of the implanted first set of p-type dopants 340 in the substrate 302. The first set of p-type dopants 340 outside the areas exposed by the first photoresist mask 338 are absorbed by the first photoresist mask 338 and the dielectric layer 318. The first photoresist mask 338 is subsequently removed, for example by an ash process, an organic wet cleanup process or a wet etch process.

Referring to FIG. 4B, a second photoresist mask 348 is formed over the existing dielectric layer 318 so as to expose an area for the RIDS region 324 of FIG. 3A while covering the area for the extrinsic base region 316. A portion of the dielectric layer 318 in the area exposed by the second photoresist mask 348 may optionally be removed as depicted in FIG. 4B, for example by a timed wet etch process, leaving a thinned layer 352 of the dielectric layer 318 in the area for the RIDS region 324. The thinned layer 352, if formed, may be, for example, 50 nanometers to 200 nanometers thick. In a first alternative of the instant example, the dielectric layer 318 may possibly not be thinned in the area exposed by the second photoresist mask 348. In a second alternative, all of the dielectric layer 318 in the area exposed by the second photoresist mask 348 may be removed. A second set of p-type dopants 350 such as boron are implanted through the dielectric layer 318 in the area for the RIDS region 324 into the substrate 302 to form a RIDS implanted region 344. The second set of p-type dopants 350 may be implanted at a dose of, for example, $3 \times 10^{14}$ cm$^{-2}$ to $2 \times 10^{15}$ cm$^{-2}$ and an energy sufficient to place a peak of a distribution of the implanted second set of p-type dopants 350 in the substrate 302. The dose of the second set of p-type dopants 350 is less than the dose of the first set of p-type dopants 340. Removing the portion of the dielectric layer 318 to form the thinned layer 352 may advantageously enable more accurate placement of the second set of p-type dopants 350 compared to implanting through the full thickness of the dielectric layer 318. The second set of p-type dopants 350 outside the areas exposed by the second photoresist mask 348 are absorbed by the second photoresist mask 348 and the dielectric layer 318. Alternatively, the dose of the second set of p-type dopants 350 may be greater than the dose of the first set of p-type dopants 340, for example, at least 50 percent greater. A chained implant of two or more doses are different energies may be performed to provide a deeper and more heavily doped RIDS implanted region 344. The second photoresist mask 348 is subsequently removed, for example by an ash process, an organic wet cleanup process or a wet etch process.

Referring to FIG. 4C, the substrate 302 is annealed so that the implanted p-type dopants in the extrinsic base implanted region 342 and the RIDS implanted region 344 of FIG. 4B diffuse and become activated to form the extrinsic base region 316 and the RIDS region 324, respectively. Forming the RIDS region 324 separately from the extrinsic base region 316 may advantageously provide a desired level of reliability of the semiconductor device 300.

Figure 4D:
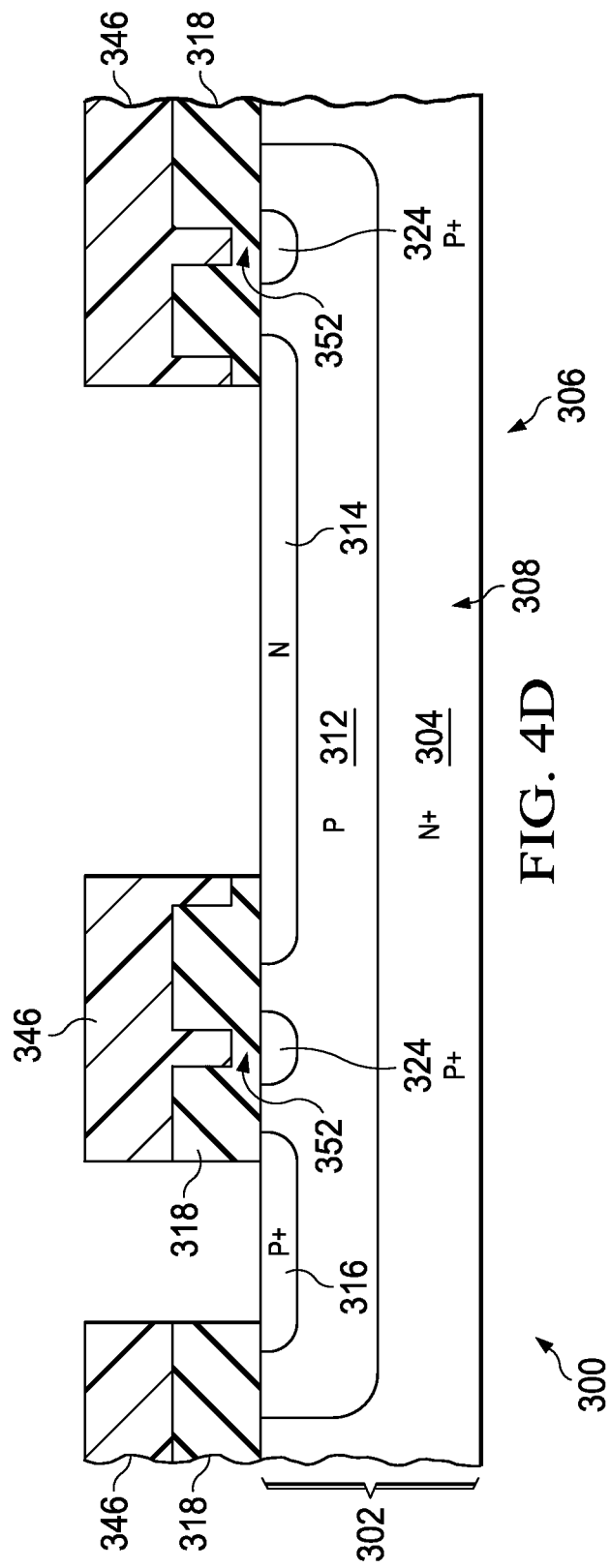

Referring to FIG. 4D, a contact mask 346 is formed by a photolithographic process over the existing dielectric layer 318 so as to expose areas for the emitter contact 320 and the base contact 322 of FIG. 3A. The dielectric layer 318 is removed from the areas exposed by the contact mask 346, for example by a wet etch process. The contact mask 346 is subsequently removed, for example by an ash process or an organic wet cleanup process. The fabrication process is continued to form the semiconductor device 300 of FIG. 3A and FIG. 3B.

Figure 5:
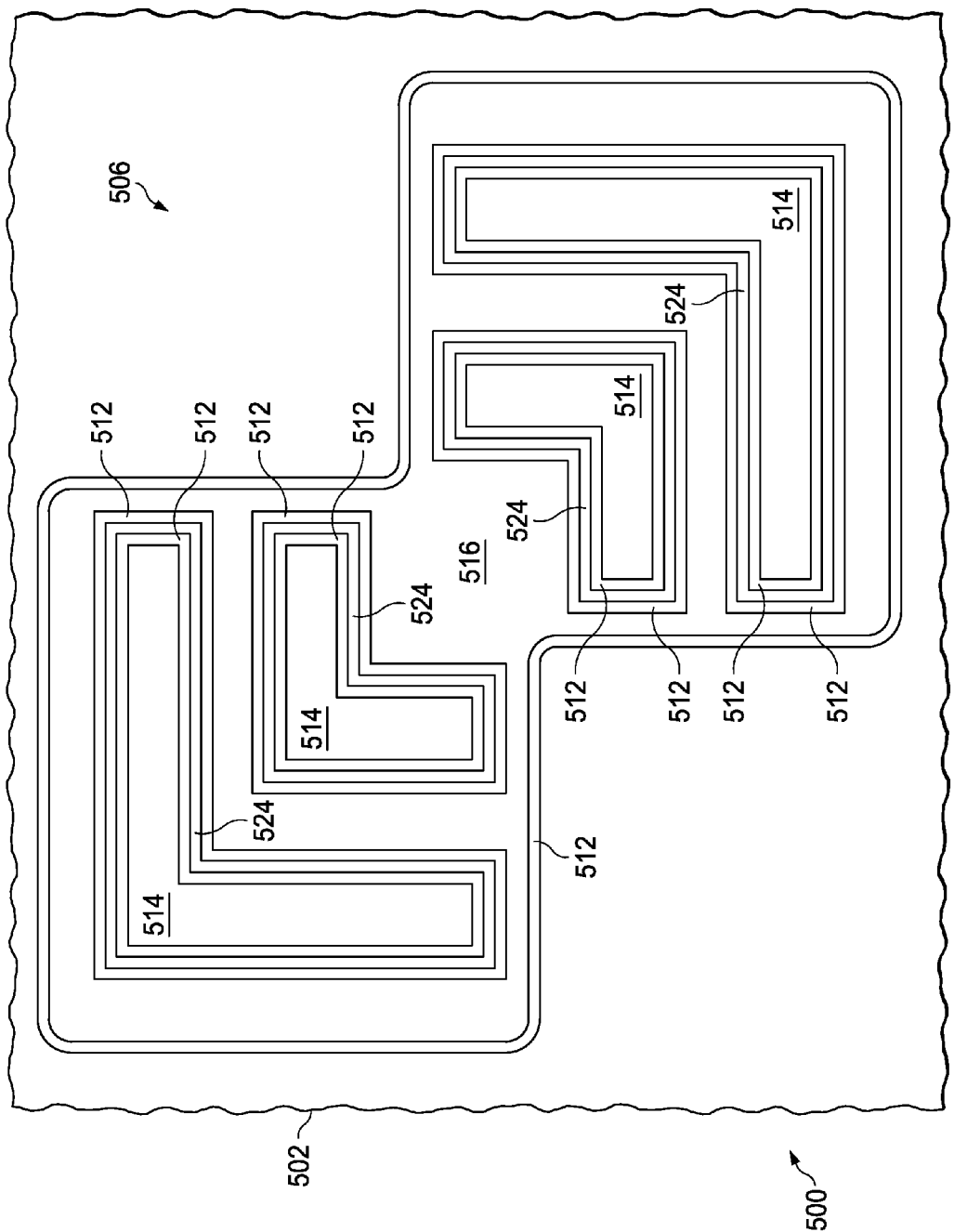
FIG. 5 is a top view of a further another exemplary semiconductor device containing an NPN bipolar junction transistor with a p-type RIDS region.

FIG. 5 is a top view of a further another exemplary semiconductor device containing an NPN bipolar junction transistor with a p-type RIDS region. The semiconductor device 500 contains the NPN bipolar junction transistor 506 which has a more complicated configuration that the examples of FIG. 1B and FIG. 3B. Dielectric layers and contacts have been omitted to more clearly show the spatial relationships among an intrinsic base region 512, an extrinsic base region 516, an emitter 514 and a RIDS region 524. In the instant example, the emitter 514 is configured in several segments. Each segment of the emitter 514 is surrounded by a separate segment of the RIDS region 524. The extrinsic base region surrounds the several segments of the RIDS region 524. Forming the RIDS region 524 surrounding each emitter 514 segment may accrue the same advantages described in reference to FIG. 1B.

The semiconductor devices described in the examples herein may be, for example, discrete devices in which the only active semiconductor components are the NPN bipolar junction transistors containing the RIDS regions. Alternatively, the semiconductor devices may be integrated circuits containing other active semiconductor components such as transistors in addition to the NPN bipolar junction transistors containing the RIDS regions. The RIDS region as described herein may be formed as part of a signal diode, a silicon controlled rectifier (SCR), an insulated gate bipolar transistor (IGBT), and a junction field effect transistor (JFET). The advantages described herein with respect to the NPN bipolar junction transistors may also accrue to these devices.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A semiconductor device, comprising:
   a substrate comprising semiconductor material;
   a dielectric layer over said substrate;
   an NPN bipolar junction transistor, comprising:
      an n-type emitter in said substrate, said n-type emitter extending up to said dielectric layer;
      a p-type extrinsic base region in said substrate, said p-type extrinsic base region extending up to said dielectric layer, said p-type extrinsic base regions being laterally separated from said n-type emitter;
      a p-type intrinsic base region in said substrate, said p-type intrinsic base region abutting said n-type emitter and extending up to said dielectric layer between said n-type emitter and said p-type extrinsic base region, said dielectric layer being at least 50 nanometers thick over said p-type intrinsic base region between said n-type emitter and said p-type extrinsic base region; and
      a p-type radiation induced diode structure (RIDS) region in said substrate, said p-type RIDS region extending up to said dielectric layer between said n-type emitter and said p-type extrinsic base region, said p-type RIDS region being laterally separated from said p-type extrinsic base region and from said n-type emitter, said p-type RIDS region having an average doping density greater than 5 times and average doping density of said p-type intrinsic base region.

2. The semiconductor device of claim 1, in which said p-type RIDS region surrounds said n-type emitter and said p-type extrinsic base region surrounds said p-type RIDS region.

3. The semiconductor device of claim 1, in which said p-type RIDS region surrounds said n-type emitter and said p-type extrinsic base region is located on one side of said n-type emitter.

4. The semiconductor device of claim 1, in which a width of said p-type RIDS region is at least 200 nanometers.

5. The semiconductor device of claim 1, in which a space between said p-type RIDS region and said n-type emitter is 1 micron to 2 microns.

6. The semiconductor device of claim 1, in which a space between said p-type RIDS region and said p-type extrinsic base region is 0.7 microns to 1.5 microns.

7. The semiconductor device of claim 1, in which said average doping density of said p-type RIDS region and an average doping density of said p-type extrinsic base region are substantially equal.

8. The semiconductor device of claim 1, in which said average doping density of said p-type RIDS region is less than half of an average doping density of said p-type extrinsic base region.

9. The semiconductor device of claim 1, in which said average doping density of said p-type RIDS region is at least 50 percent greater than an average doping density of said p-type extrinsic base region.

10. The semiconductor device of claim 1, in which said dielectric layer comprises silicon dioxide.

11. A method of forming a semiconductor device, comprising the steps:
   providing a substrate comprising semiconductor material;
   forming a dielectric layer over said substrate;
   forming a p-type intrinsic base region of an NPN bipolar junction transistor in said substrate;
   forming an n-type emitter in said substrate abutting said p-type intrinsic base region, said n-type emitter extending up to said dielectric layer;
   implanting p-type dopants into said substrate to form a p-type extrinsic base region in said substrate abutting said p-type intrinsic base region, said p-type extrinsic base region extending up to said dielectric layer, said p-type extrinsic base regions being laterally separated from said n-type emitter, and said p-type intrinsic base region extending up to said dielectric layer between said n-type emitter and said p-type extrinsic base region, said dielectric layer being at least 50 nanometers thick over said p-type intrinsic base region between said n-type emitter and said p-type extrinsic base region; and
   implanting p-type dopants into said substrate top form a p-type RIDS region in said substrate, said p-type RIDS region extending up to said dielectric layer between said n-type emitter and said p-type extrinsic base region, said p-type RIDS region being laterally separated from said p-type extrinsic base region and from said n-type emitter, said p-type RIDS region having an average doping density greater than 5 times and average doping density of said p-type intrinsic base region.

12. The method of claim 11, in which said p-type RIDS region surrounds said n-type emitter and said p-type extrinsic base region surrounds said p-type RIDS region.

13. The method of claim 11, in which said p-type RIDS region surrounds said n-type emitter and said p-type extrinsic base region is located on one side of said n-type emitter.

14. The method of claim 11, in which a width of said p-type RIDS region is at least 200 nanometers.

15. The method of claim 11, in which a space between said p-type RIDS region and said n-type emitter is 1 micron to 2 microns.

16. The method of claim 11, in which a space between said p-type RIDS region and said p-type extrinsic base region is 0.7 microns to 1.5 microns.

17. The method of claim 11, in which said steps of implanting p-type dopants into said substrate to form said p-type extrinsic base region and implanting p-type dopants into said substrate top form said p-type RIDS region are performed concurrently.

18. The method of claim 11, in which said step of implanting p-type dopants into said substrate top form said p-type RIDS region is performed with a lower dose than said step of implanting p-type dopants into said substrate to form said p-type extrinsic base region, so that said average doping density of said p-type RIDS region is less than half of an average doping density of said p-type extrinsic base region.

19. The method of claim 11, in which said step of implanting p-type dopants into said substrate top form said p-type RIDS region is performed with a higher dose than said step of implanting p-type dopants into said substrate to form said p-type extrinsic base region, so that said average doping density of said p-type RIDS region is at least 50 percent greater than an average doping density of said p-type extrinsic base region.

20. The method of claim 10, in which said step of forming said dielectric layer comprises forming silicon dioxide by thermal oxidation of silicon in said semiconductor material of said substrate.

* * * * *